US006901532B2

United States Patent
DeRuiter et al.

(10) Patent No.: US 6,901,532 B2
(45) Date of Patent: May 31, 2005

(54) SYSTEM AND METHOD FOR RECOVERING FROM RADIATION INDUCED MEMORY ERRORS

(75) Inventors: John L. DeRuiter, Phoenix, AZ (US); William S. Nelson, Phoenix, AZ (US)

(73) Assignee: Honeywell International Inc., Morristown, NJ (US)

( * ) Notice: Subject to any disclaimer, the term of this patent is extended or adjusted under 35 U.S.C. 154(b) by 490 days.

(21) Appl. No.: 10/108,955

(22) Filed: Mar. 28, 2002

(65) Prior Publication Data

US 2003/0188219 A1 Oct. 2, 2003

(51) Int. Cl.⁷ .............................................. G06F 11/00
(52) U.S. Cl. ............................................. 714/5; 714/49
(58) Field of Search .................. 714/5, 52, 49

(56) References Cited

U.S. PATENT DOCUMENTS

| 5,678,020 A | * | 10/1997 | Singh et al. ............... 711/100 |
| 5,778,433 A | * | 7/1998 | Collins et al. ............... 711/135 |
| 6,108,758 A | * | 8/2000 | Liu ............................ 711/167 |
| 6,195,729 B1 | * | 2/2001 | Arimilli et al. ............. 711/119 |
| 6,463,507 B1 | * | 10/2002 | Arimilli et al. ............. 711/122 |
| 6,751,720 B2 | * | 6/2004 | Barroso et al. ............. 711/210 |
| 2003/0131277 A1 | * | 7/2003 | Taylor et al. ................... 714/5 |
| 2004/0078702 A1 | * | 4/2004 | Yoshizawa et al. ........... 714/42 |
| 2004/0139280 A1 | * | 7/2004 | Quach et al. ................ 711/118 |

FOREIGN PATENT DOCUMENTS

| EP | 0128353 A | 12/1984 |
| EP | 0300166 A | 1/1989 |
| EP | 0321793 A | 6/1989 |

OTHER PUBLICATIONS

"Fault–Tolerant Cache," IBM Technical Disclosure Bulletin, IBM Corp., New York, USA, vol. 33, No. 6A, Nov. 1, 1990, pp. 427–428: the whole document.

* cited by examiner

Primary Examiner—Bryce P Bonzo

(57) ABSTRACT

A system and method for recovering from radiation induced memory errors invalidates information stored in a cache memory, upon the detection of the memory error. The cache memory is then reloaded with valid information.

16 Claims, 2 Drawing Sheets

SYSTEM AND METHOD FOR RECOVERING FROM RADIATION INDUCED MEMORY ERRORS

BACKGROUND OF THE INVENTION

The present invention is generally directed to recovering from memory errors and, more specifically, to recovering from radiation induced memory errors.

Today, commercially available microprocessors are generally not designed to operate in a space borne environment. As such, these commercial microprocessors are subject to radiation induced errors. For example, single event upsets (SEUs) can occur when an ionized particle hits a flip-flop or a memory cell, associated with the microprocessor, and changes the state of the associated flip-flop or memory cell. These radiation induced errors can result in incorrect calculations and faulty program execution, as well as system reset and a loss of state, due to timeout of a watchdog timer. Further, even when a microprocessor is radiation hardened, the microprocessor is still subject to SEUs of internal flip-flops and/or memory cells.

In a memory that includes a parity generator/checker circuit (and when parity checking is enabled), each time a data byte, i.e., eight bits, is written to the memory the circuit examines the byte and determines whether the byte has an even or odd number of 'ones'. In the case of odd parity, when the data byte has an even number of 'ones' a parity bit, i.e., a ninth bit, is set to 'one'. Otherwise, the parity bit is set to 'zero'. The result is that no matter how many 'ones' were in the original eight bits of data, there are an odd number of ones when all nine bits are examined. Alternatively, instead of implementing odd parity the circuit may implement even parity such that the sum of the 'ones' is an even number. In a typical microprocessor system, when a byte is read from memory the circuit checks the parity of the byte to determine whether a parity error is indicated.

In a typical microprocessor system, when a parity error is detected a parity checker/generator circuit generates a non-maskable interrupt (NMI), which is usually used to instruct a microprocessor to immediately halt. This is done to ensure that invalid data does not corrupt valid data. In many microprocessor systems, a watchdog timer, which can be implemented in hardware or software, may be the only means for detecting when an execution error occurs. Alternatively, the watchdog timer may also be implemented in conjunction with a parity generator/checker circuit to detect memory errors. In either case, the microprocessor generally executes code until the watchdog timer times-out or an unrecoverable software occurs.

Microprocessors that have an internal cache memory with a parity generator/checker circuit may provide an output from the circuit off-chip and may also include an external flush line, which causes the microprocessor to flush its internal cache when it receives an appropriate signal. However, in general, space borne microprocessor systems have only used watchdog timers to detect memory errors attributable to SEUs. As a result, for microprocessor systems used in space born environments, the time period between when an application error occurs and the microprocessor system recovers from the error has generally been relatively long and has required resetting the microprocessor system.

What is needed is a technique for recovering from radiation induced memory errors that is both efficient and timely. It would also be desirable to recover from a radiation induced memory error without resetting the microprocessor system.

SUMMARY OF THE INVENTION

The present invention is directed to a system and method for recovering from a radiation induced memory error. Initially, a memory error in a cache memory is detected and information currently stored in the cache memory is invalidated. Then, the cache memory is reloaded with valid information.

These and other features, advantages and objects of the present invention will be further understood and appreciated by those skilled in the art by reference to the following specification, claims and appended drawings.

DETAILED DESCRIPTION OF THE PREFERRED EMBODIMENT(S)

A relatively large percentage (e.g., approximately ninety percent) of single event upsets (SEUs), i.e., radiation induced errors, are attributable to errors in memory cells of an internal (i.e., level 1 (L1) cache memory. While the discussion herein is primarily directed to an L1 cache memory, the techniques disclosed herein are also applicable to external cache memories (e.g., level 2 (L2) cache memories). According to the present invention, when an SEU is detected by an error detection circuit (e.g., a parity checker/generator circuit associated with an L1 cache memory), error processing logic provides a command to a processor core (i.e., an execution unit), which causes the core to flush the L1 cache and reload the L1 cache with valid information.

Figure 1:
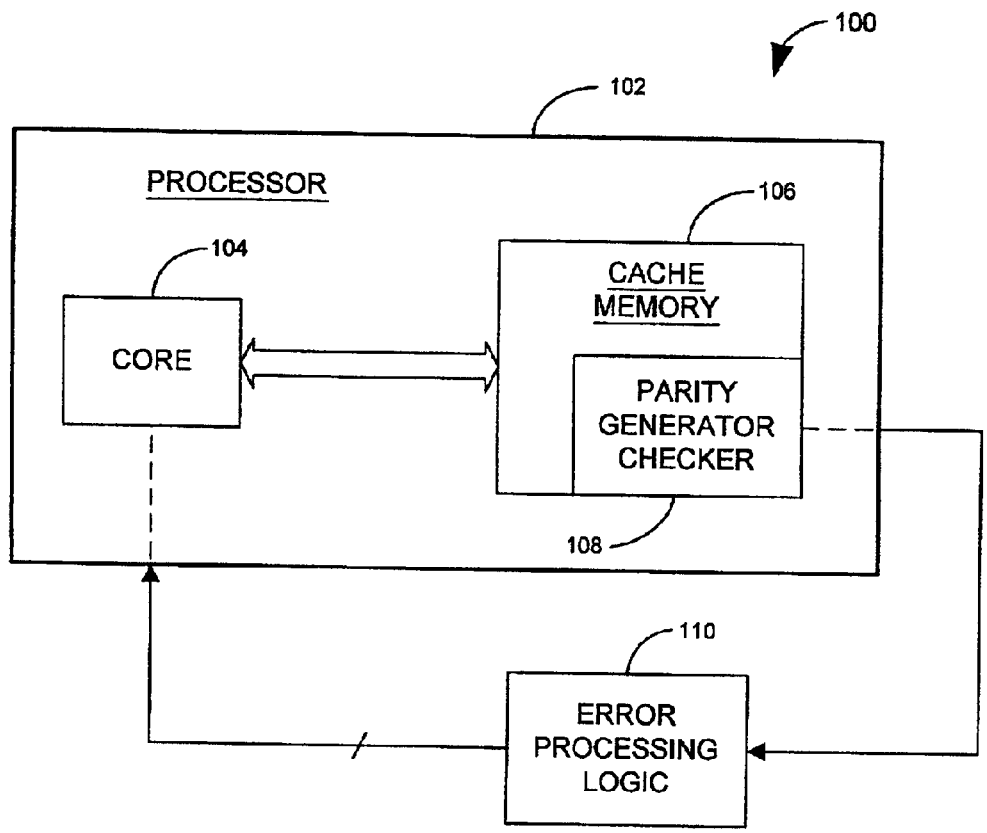
FIG. 1 is a block diagram of an exemplary processor system that detects single event upsets (SEUs), according to an embodiment of the present invention.

FIG. 1 depicts a processor system 100 that includes error processing logic 110, constructed according to an embodiment of the present invention. A processor 102 includes a processor core 104, which is coupled to an internal level 1 (L1) cache memory 106. As shown in the block diagram of FIG. 1, the cache memory 106 includes a parity generator/checker circuit 108. The circuit 108 detects parity errors in the cache memory 106 and provides an indication of those errors to the error processing logic 110, which upon detecting an error may provide a signal to the core 104, which causes the core to flush the cache memory and reload the cache memory 106 with valid data and, as such, eliminate the memory error. Alternatively, the logic 110 may provide a command to the processor core 104, which causes the processor core 104 to execute a routine, which causes the cache memory 106 to be flushed and loaded with valid information.

Figure 2:
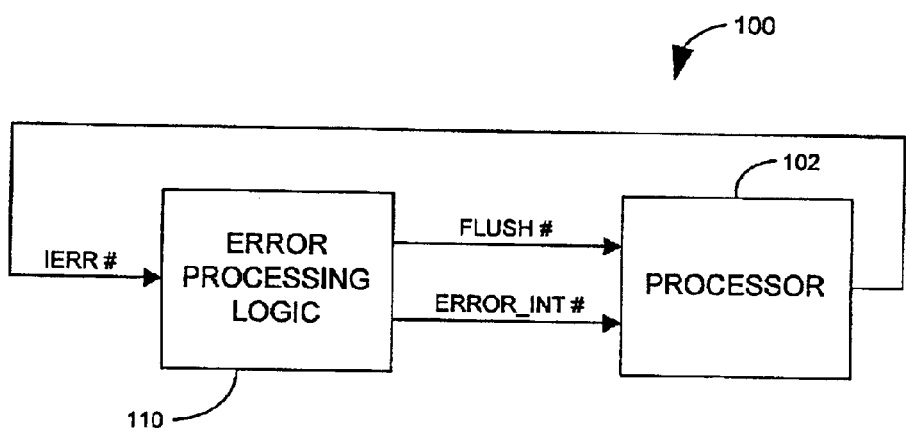
FIG. 2 is a block diagram of an exemplary processor system that detects SEUs, according to another embodiment of the present invention.

FIG. 2 depicts a block diagram of the system 100 and further illustrates that the processor 102 provides a signal (i.e., IERR#) to the error processor logic 110 that indicates that an error has occurred within the memory 106 of the processor 102. Upon detecting a memory error, the error processing logic 110 may provide a hardware signal (FLUSH#) or a software command (ERROR_INT#) to the processor 102. As previously stated, the IERR# signal provides a memory error indication to the logic 110. Responsive to the error indication, the logic 110 may generate the FLUSH# signal or the ERROR_INT# command. As mentioned above, the FLUSH# signal is a hardware oriented signal that autonomously flushes the cache memory 106 to eliminate the memory error and the ERROR_INT# signal is utilized by the core 102 to flush the cache memory 106 under software control. Implementation of the FLUSH# signal function allows for flushing and invalidation of information within the cache memory 106, without requiring the processor 102 to implement a recovery routine. The error processing logic 110 may be implemented within a variety of devices, e.g., a field programmable gate array (FPGA), or may be implemented with relatively few less complex gates.

Figure 3:
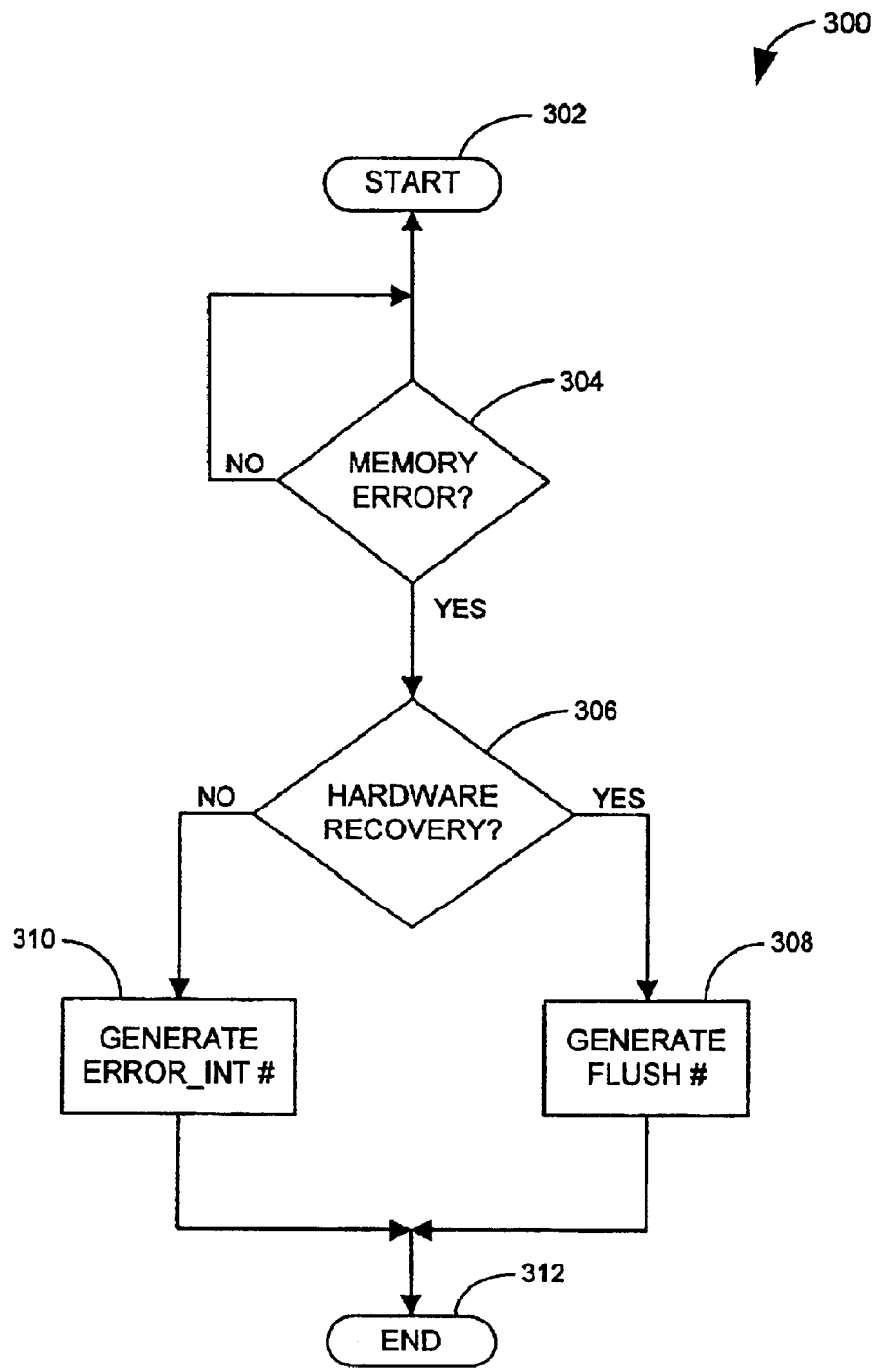
FIG. 3 is a flow chart of an exemplary process for recovering from a memory error caused by an SEU, according to the present invention.

Turning to FIG. 3, a process 300 for recovering from a memory error is illustrated. In step 302, the process 300 is initiated at which point control transfers to decision step 304. In step 304, the process 300 determines whether a memory error has occurred, for example, by examining the parity of a byte for proper parity when it is read from the cache memory 106. If a memory error is not detected, control loops on step 304. When a memory error is detected, control transfers from step 304 to decision 306. In step 306, the process 300 determines whether a hardware or a software recovery is desired. The determination of whether hardware or a software recovery is required may be dictated by, for example, a value stored within a register implemented within the error processing logic 110. When a hardware recovery is required, control transfers from step 306 to step 308, where the logic 110 generates the FLUSH# signal to the core 104 of the processor 102. When a software error recovery is required, control transfers from step 306 to step 310 where the logic 110 generates an ERROR_INT# command, which causes the processor 102 to implement a routine, which causes the cache memory 106 to be flushed and reloaded with valid information. From steps 308 and 310, control transfers to step 312 where the process 300 terminates.

Accordingly, a technique has been described herein that allows a processor to recover from SEU induced memory errors in a relatively efficient, rapid manner. Thus, reducing the likelihood of miscalculations and failed program execution. Such a system and method can also prevent the loss of state due to a watchdog timer timeout, which occurs when the processor system resets. It should be appreciated that the flushing method is processor dependent. That is, while FIG. 2 illustrates recovery from memory errors using both a hardware and software recovery techniques, in all likelihood only one of the methods would be utilized, depending upon the design of the processor. Thus, depending upon the design of the processor, recovery can be autonomous or initiated under processor control, via a software interrupt routine.

The above description is considered that of the preferred embodiments only. Modification of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the Doctrine of Equivalents.

What is claimed is:

1. A method for recovering from a radiation induced memory error, comprising the steps of:

detecting a memory error in a cache memory;
   providing an error indication of the memory error;
   processing the error indication to determine whether a hardware recovery or a software recovery should be implemented and, based on the determination, providing an associated processor appropriate command to implement either the hardware recovery or the software recovery;
   invalidating stored information in response to the associated processor appropriate command; and
   reloading the memory with valid information.

2. The method of claim 1, wherein error processing logic coupled to the memory generates the processor appropriate command which causes a processor core to the processor to implement the software recovery, during which the processor core executes a routine that causes the stored information to be replaced with the valid information.

3. The method of claim 1, wherein error processing logic coupled to the memory generates the processor appropriate command which causes the processor core to implement the hardware recovery, during which the stored information is autonomously replaced with the valid information.

4. The method of claim 1, wherein the memory includes parity circuitry that detects parity errors in the stored information and generates the error indication.

5. The method of claim 1, wherein the memory is a level 1 (L1) cache memory.

6. The method of claim 1, wherein the memory is a level 2 (L2) cache memory.

7. A processing system that automatically recovers from radiation induced memory errors, the system comprising:

a processor core;
   a memory coupled to the processor core, wherein the memory stores information and includes parity circuitry for detecting a memory error in the memory; and
   error processing logic coupled to the memory, wherein the error processing logic, upon the detection of the memory error, determines whether a hardware recovery or a software recovery should be implemented and, based on the determination, provides a signal to the processor core which causes the processor core to replace the stored information with valid information using either the hardware recovery or the software recovery.

8. The system of claim 7, wherein the error processing logic generates a command which causes the processor core to implement the software recovery, during which the processor core executes a routine that causes the stored information to be replaced with the valid information.

9. The system of claim 7, wherein the error processing logic generates a signal which causes the processor core to implement the hardware recovery, during which the processor core autonomously replaces the stored information with the valid information.

10. The system of claim 7, wherein the memory is a level 1 (L1) cache memory.

11. The system of claim 7, wherein the memory is a level 2 (L2) cache memory.

12. A processing system that automatically recovers from radiation induced memory errors, the system comprising:

a processor core;
   a cache memory coupled to the processor core, wherein the memory stores information and includes parity circuitry for detecting a memory error in the memory; and
   error processing logic coupled to the memory, wherein the error processing logic, upon the detection of the memory error, determines whether a hardware recovery or a software recovery should be implemented and, based on determination, provides a signal to the processor core which causes the processor core to replace the stored information with valid information using either the hardware recovery or the software recovery.

13. The system of claim 12, wherein the error processing logic generates a command which causes the processor core to implement the software recovery, during which the processor core executes a routine that causes the stored information to be replaced with the valid information.

14. The system of claim 12, wherein the error processing logic generates a signal which causes the processor core to implement the hardware recovery, during which the processor core autonomously replaces the stored information with the valid information.

15. The system of claim 12, wherein the memory is a level 1 (L1) cache memory.

16. The system of claim 12, wherein the memory is a level 2 (L2) cache memory.

* * * * *